US008970373B2

(12) United States Patent
Buckley et al.

(10) Patent No.: US 8,970,373 B2
(45) Date of Patent: Mar. 3, 2015

(54) LARGE GAP DOOR/WINDOW, HIGH SECURITY, INTRUSION DETECTORS USING MAGNETOMETERS

(75) Inventors: Mark C. Buckley, Pollock Pines, CA (US); Dave Eugene Merritt, Rocklin, CA (US)

(73) Assignee: Honeywell International Inc., Morristown, NJ (US)

( * ) Notice: Subject to any disclaimer, the term of this patent is extended or adjusted under 35 U.S.C. 154(b) by 332 days.

(21) Appl. No.: 13/441,959

(22) Filed: Apr. 9, 2012

(65) Prior Publication Data

US 2013/0265162 A1 Oct. 10, 2013

(51) Int. Cl.

| | |
|---|---|
| ***G08B 13/08*** | (2006.01) |
| ***G08B 21/00*** | (2006.01) |
| ***G08B 23/00*** | (2006.01) |
| ***G08B 13/24*** | (2006.01) |
| ***H01H 9/00*** | (2006.01) |
| ***G01R 33/00*** | (2006.01) |
| ***G08B 13/00*** | (2006.01) |
| ***G08B 21/18*** | (2006.01) |

(52) U.S. Cl.

CPC ................ *G08B 13/00* (2013.01); *G08B 21/18* (2013.01)

USPC ..................... 340/545.1; 340/686.6; 340/517; 340/547; 340/551; 335/206; 324/260

(58) Field of Classification Search

USPC ........... 340/545.1, 686.6, 547, 550, 573, 541, 340/551, 545, 522, 3.1, 686.1, 517, 562, 340/555, 5.71, 426.28, 545.8; 324/207.22, 324/260; 335/205, 207, 209, 215, 228

See application file for complete search history.

(56) References Cited

U.S. PATENT DOCUMENTS

| | | | | |
|---|---|---|---|---|
| 3,305,805 | A | 2/1967 | Tann | |
| 3,745,553 | A | 7/1973 | Kardashian | |
| 4,359,646 | A | 11/1982 | Mejia et al. | |
| 4,507,654 | A | 3/1985 | Stolarczyk et al. | |
| 4,812,674 | A | 3/1989 | Sue et al. | |
| 5,004,999 | A | 4/1991 | Hartmann et al. | |
| 5,155,469 | A | 10/1992 | Hartmann et al. | |
| 5,499,016 | A * | 3/1996 | Pantus | 340/555 |
| 5,534,849 | A * | 7/1996 | McDonald et al. | 340/517 |
| 5,654,686 | A | 8/1997 | Geschke et al. | |
| 6,310,549 | B1 | 10/2001 | Loftin et al. | |
| 6,472,993 | B1 * | 10/2002 | Addy | 340/686.1 |
| 6,784,796 | B2 | 8/2004 | Johnston et al. | |
| 6,963,281 | B2 | 11/2005 | Buckley | |
| 7,120,795 | B2 | 10/2006 | Raphael et al. | |
| 7,356,429 | B2 | 4/2008 | Eskildsen | |
| 7,663,483 | B2 | 2/2010 | Spenik et al. | |

(Continued)

OTHER PUBLICATIONS

Honeywell—968XTP Maximum Security Switch—Installation Instructions, Dec. 2006.

Honeywell—HMC5883L 3-Axis Digital Compass IC, Oct. 2010.

Magnetometers come in multiple flavors << The Embedded Beat: Freescale Blog Communication, Mar. 4, 2011.

(Continued)

*Primary Examiner* — Mirza Alam

(74) *Attorney, Agent, or Firm* — Husch Blackwell LLP

(57) ABSTRACT

A door, or window detector incorporates a magnet and a magnetometer. Dual loop processing can be provided for real-time signals from the magnetometer, as the magnet moves relative to it, to determine when at least one of small gap or large gap indicating alarms should be issued. Security can be substantially increased by randomizing the orientation of the magnet.

6 Claims, 8 Drawing Sheets

(56) References Cited

U.S. PATENT DOCUMENTS

| | | | | |
|---|---|---|---|---|
| 7,986,232 | B2 | 7/2011 | Sharma | |
| 2006/0055534 | A1* | 3/2006 | Fergusson | 340/562 |
| 2008/0143526 | A1* | 6/2008 | Spenik et al. | 340/547 |
| 2010/0219951 | A1* | 9/2010 | Sosa | 340/551 |

OTHER PUBLICATIONS

Honeywell—Hardware Specification and Design 58160D, Jun. 2011.

MultiDimension Technology Co., Ltd.—MMLP57H TMR Linear Sensor.

* cited by examiner

MAGNETOMETER BASED DOOR/WINDOW SENSOR ALARM DECISION FLOW CHART

LARGE GAP DOOR/WINDOW, HIGH SECURITY, INTRUSION DETECTORS USING MAGNETOMETERS

FIELD

The application pertains to position detectors. More particularly, the application pertains to detectors usable to detect displacement of doors and windows from closed positions to partly, or fully open positions and to produce indicators thereof which can be transmitted to regional monitoring systems.

BACKGROUND

Regional security monitoring systems often contain detectors that monitor the open/closed state of doors and windows. The vast majority of known non-contact door and window detectors consist of a magnet mounted on the door or window and a reed switch in a housing mounted on the door frame or window frame. This type of detector is generically referred to as a "magnetic contact". The problem with the magnet/reed switch combination is that the sensing range (gap between the pair) is limited to ½ to 1 inch for standard magnetic contacts and up to 3 inches if the design contains very large/expensive magnets on the door and/or a "helper magnet" in the sensor housing. These gaps only apply on non-ferromagnetic materials (wood). The gap for most sensors is reduced to ½ that noted when mounted on ferromagnetic materials such as steel. This means the maximum gap available on steel in the industry today is on the order of 1.5 inches.

Users would like to achieve a gaps on steel greater than 1.5 inches and up to 4 inches. They want to install door detectors on perimeter fences, sheds and pool gates. These doors have large gaps and the doors and frames are often made of steel. Also, as these are typically outdoor detectors, the users would like these to be wireless and not require battery replacement for five years.

Additionally, a given magnetic contact (magnet/reed switch pair) will have a specific distance at which the detector will indicate the door is open. There is no adjustment capability in these units. Therefore, if an installer has some doors and windows that he would like to set to alarm at a small gap and others like pool gates that he would like to set for large gaps, then he must carry two different products. Users would like a door window detector that can be set for small gaps and large gaps with a minimum of field adjustment and preferably no physical adjustment at the sensor.

High Security (Defeat Resistant) Magnetically Actuated Contacts have been in the Intrusion Security market place for a number of years. These are typically in the form of magnetically balanced contacts where a switch housing contains multiple form C reed switches and multiple magnets. In the absence of the door mounted magnet assembly, each reed switch in the housing is actuated by a corresponding magnet in the housing. When the door mounted magnet assembly which contains multiple magnets comes into proper position, the magnetic field at each reed switches is cancelled out (balanced) allowing each reed to be in the un-actuated state. If the door mounted magnet assembly gets too close or too far away, at least one reed switch in the switch housing will actuate causing an alarm. Manufacture of this type of switch is highly labor intensive as the positions of the magnets and reed switches must be massaged due to tolerances to get the "balance" just right. In known products, one of the issues has been that the installer must be very careful to precisely set the gap between the switch housing and the magnet housing. Too small or too large and the switch will go into alarm. Although quite difficult to defeat, one cognizant of the design and armed with an identical door mount magnet assembly does have the possibility of defeating a high security contact. It takes significant practice but it can be done. The high end market, banks, nuclear facilities, military contractors and the military, is asking for a virtually defeat proof contact.

Most professional security manufacturers strive to have their products meet the requirements set in the standards published by the governing compliance agencies. The requirements for contacts sold in the Americas are published in UL 634. The requirements for contacts sold in Europe are covered in EN50131-2-6. The requirements set for the highest grade or level contacts in each standard are intended to provide sufficient safe-guards against intruders that are assumed to be highly intelligent, highly skilled in the detector design, and have attempted to defeat similar product. Products passing these requirements are intended for use in high security installations such as military and nuclear facilities. In October of 2007, UL published requirements for a higher grade of High Security contact, UL 634 Level 2. The requirements for Level 2 specify many more and more intricate attacks on the sensor which High Security Contacts on the market at that time could not meet. In September 2008, Europe published requirements for 4 grades of magnetically actuated switches in EN 50131-2-6 with Grade 1 having the least stringent requirements and Grade 4 being the most stringent. The Honeywell 968XTP is certified to the requirements of the second highest grade, Grade 3 but does not meet the requirements of the highest grade, Grade 4. The requirements state that Grade 4 switch products must have a minimum of 8 match-coded-pairs of switches/door magnets where a given switch assembly can only function with one of the at least 8 different magnets.

Using the existing approaches, this would mean a minimum of 8 different SKU's for one model number. Producing a product line with 8 match coded pairs could be extremely labor intensive. In addition, the number of parts for a product that will function singularly with 8 match-coded-pairs would increase significantly to account for the additional magnets and reeds that would be required to satisfy this requirement.

DETAILED DESCRIPTION

Figure 1:
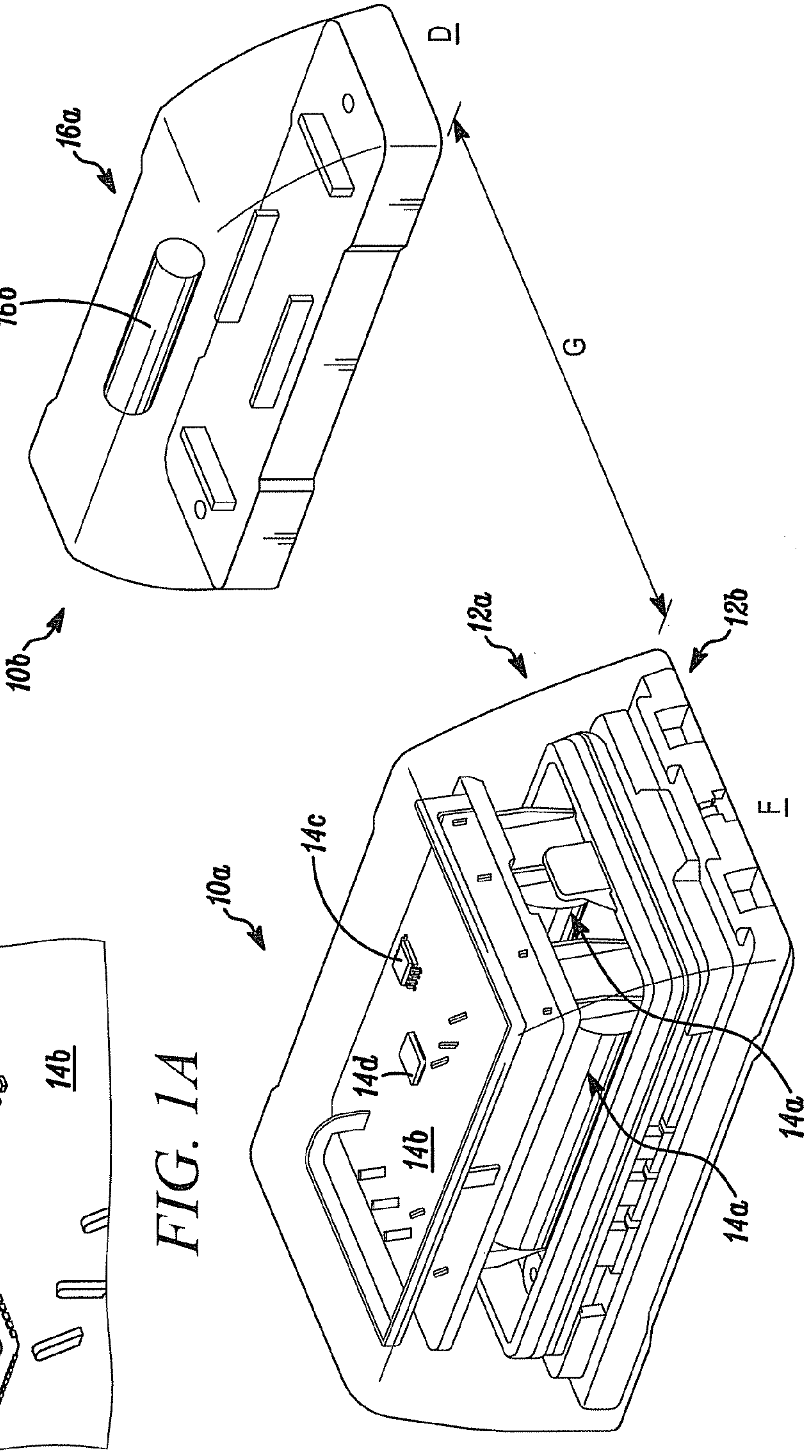
FIG. 1 is a perspective view of a detector in accordance herewith.
Figure 1A:
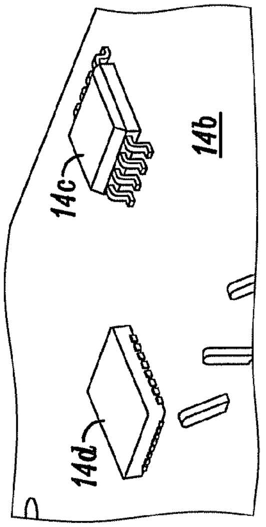
FIG. 1A is an enlarged view of a portion of the detector of FIG. 1.

While disclosed embodiments can take many different forms, specific embodiments hereof are shown in the drawings and will be described herein in detail with the understanding that the present disclosure is to be considered as an exemplification of the principles hereof, as well as the best mode of practicing same, and is not intended to limit the claims hereof to the specific embodiment illustrated.

Embodiments hereof advantageously utilize a high sensitivity low current draw magnetometer to sense movement of a local, but displaced, magnet. In one aspect, one sensor can be used to detect gaps from zero to the large gaps desired. In a further aspect, signals can be transmitted on two or more alarm loops where a large gap threshold is set for one loop, say a 6" gap, and a small gap threshold will be set for the other loop, say a 1" gap. The installer can decide which loop the respective security control panel will act on. Therefore this invention solves the final installer issue of using one sensor for large or small gap performance with no adjustment required at the sensor.

In another aspect, the detector can include control circuits implemented, for example with an ASIC or a programmable microcontroller, or programmable processor. The circuitry could contain magnetic field thresholds for a low sensitivity reporting loop (loop 1) which would equate to the door/window magnet at a distance of say 1 inch and a high sensitivity reporting loop (loop 2) which would equate to the door/window magnet at a distance of say 6 inches.

In embodiments hereof, the circuitry could perform the following operations at a frequency sufficient to preclude the ability of an intruder to open a door, gain access and close the door. The frequency of operation would be at least 3 times per second to preclude this. Although a significantly higher frequency can be used in a wired sensor, a wireless sensor will use a lower frequency that will insure detection while maximizing battery life. The circuitry would monitor the field strength reported by the magnetometer. It would compare the field strength to the high threshold set for loop 1 and the low threshold set for loop 2

If the field strength is above the thresholds set for both loop 1 and loop 2, the circuitry will set the status flag for both loops 1 and 2 to normal, indicative of a no alarm state, as the magnet is within the max gap of both loops. If the field strength is below the high threshold set for loop 1 and above the low threshold set for loop 2, the circuitry sets a flag of normal for a normal loop 2 state and sends a transmission to the alarm system control panel identifying that loop 1 is in alarm and loop 2 is normal. If the field strength is below the threshold set for both loops, the circuitry sends a transmission to the panel identifying that both loop 1 and loop 2 are in alarm.

In another embodiment, a high sensitivity 3-axis magnetometer and control circuitry can be incorporated into a door frame mountable detector assembly, and, a randomly oriented magnet can be incorporated in a door mountable magnet housing. The 3-axis magnetometer will output the sensed X, Y, and Z components of the magnetic flux vector present at the sensor. The majority of this vector is produced by the randomly oriented magnet.

During installation, the circuitry will learn the magnitude and direction (+ or −) of each of the magnetic vector components when the door is closed with magnet in place. The control circuitry will then assign a factory loaded tolerance band to each of these vector component values. If the vector value goes outside of the allowable band, the detector assembly issues an alarm.

To meet the EN Grade 4 requirements, the detector assembly can be field programmable to work with a unique magnet assembly. At least 8 different magnet assemblies are needed to comply with these requirements. It is a particular advantage of this embodiment that one small and inexpensive magnet can be configured to produce an infinite number of different magnet assemblies. This result can be effected by changing the orientation of the magnet in each magnet assembly.

The magnet can be enclosed in a plastic sphere and placed in a housing which contains a recess to locate the sphere. During assembly of the magnet and spherical shell, the finished sphere assemblies are tossed into a bin in no given orientation. At the next assembly station the spheres are dropped into recesses of the magnet housing component referred to as the "carrier" in the attachment. The resulting orientation of the magnets and spheres will be completely random. This now achieves the EN criteria for a minimum of 8 different codes and actually results in an infinite number of unique magnet assemblies.

Since the sensor will "learn" the unique magnetic vector of each magnet assembly when installed, the installer will not be confined to tight gap tolerances during installation. Any foreign magnet that is brought into the vicinity of the sensor will force at least one of the magnetic field vector components (X, Y, or Z) to move beyond its' permitted boundaries resulting in an alarm.

It would be extremely difficult for a person practiced in the art of defeating balanced magnetic switches to defeat this invention if he had an identical magnet assembly. However, since no two magnet assemblies will be identical, this person has no chance of defeating this invention. As an additional feature a small boss can be formed on or attached to the sphere, for example 1 mm in diameter by 1 mm tall, in-line with the magnet axis. This would preclude the magnet from ever being directly aligned with one of magnetometer axes X, Y, or Z therefore insuring that the magnetic vector has significant components on at least 2 of the 3 magnetometer sensing axes.

After the detector assembly and magnet assembly have been installed, for example on a respective door and frame, and with the door closed, the detector assembly will "learn" the magnetic field vector present at the magnetometer in this secure configuration. Insuring that the door is closed, the installer would connect the wires to the panel and apply power. The sensor will verify the magnetometer output on at least one axis (X, Y, or Z) exceeds 750 milligauss and the values seen on all axes are stable. The sensor will then record the values for X, Y and Z and establish the alarm points for each axis.

If the value for any axis exceeds its' alarm points, the sensor will issue an alarm signal by opening the Alarm Relay. On power-up, the sensor will insure that the door magnet is present by verifying that at least one magnetic vector component value exceeds 750 milligauss. This is to insure that the sensor is not being set to the earth's magnetic field without the door magnet present.

Unknown to many, the Earth's magnetic field vector has a stronger vertical component than horizontal component in all of North America and Europe. The intensity of the Earth's magnetic field varies significantly around the world. We must insure that this invention will work everywhere. The Earth's maximum magnetic field intensity on the surface of the Earth in an inhabited location occurs in Southern Australia in Hobart. The intensity is 620 milligauss with the vertical component being 592 milligauss and the horizontal component being 186 milligauss. The absolute maximum occurs at a location on the coast of Antarctica nearest Australia with a value of 660 milligauss. By setting the sensor minimum to 750 milligauss as a condition to record the door closed values, we insure that the sensor is not errantly setting the values for the Earth's magnetic field with the door open.

Figure 1B:
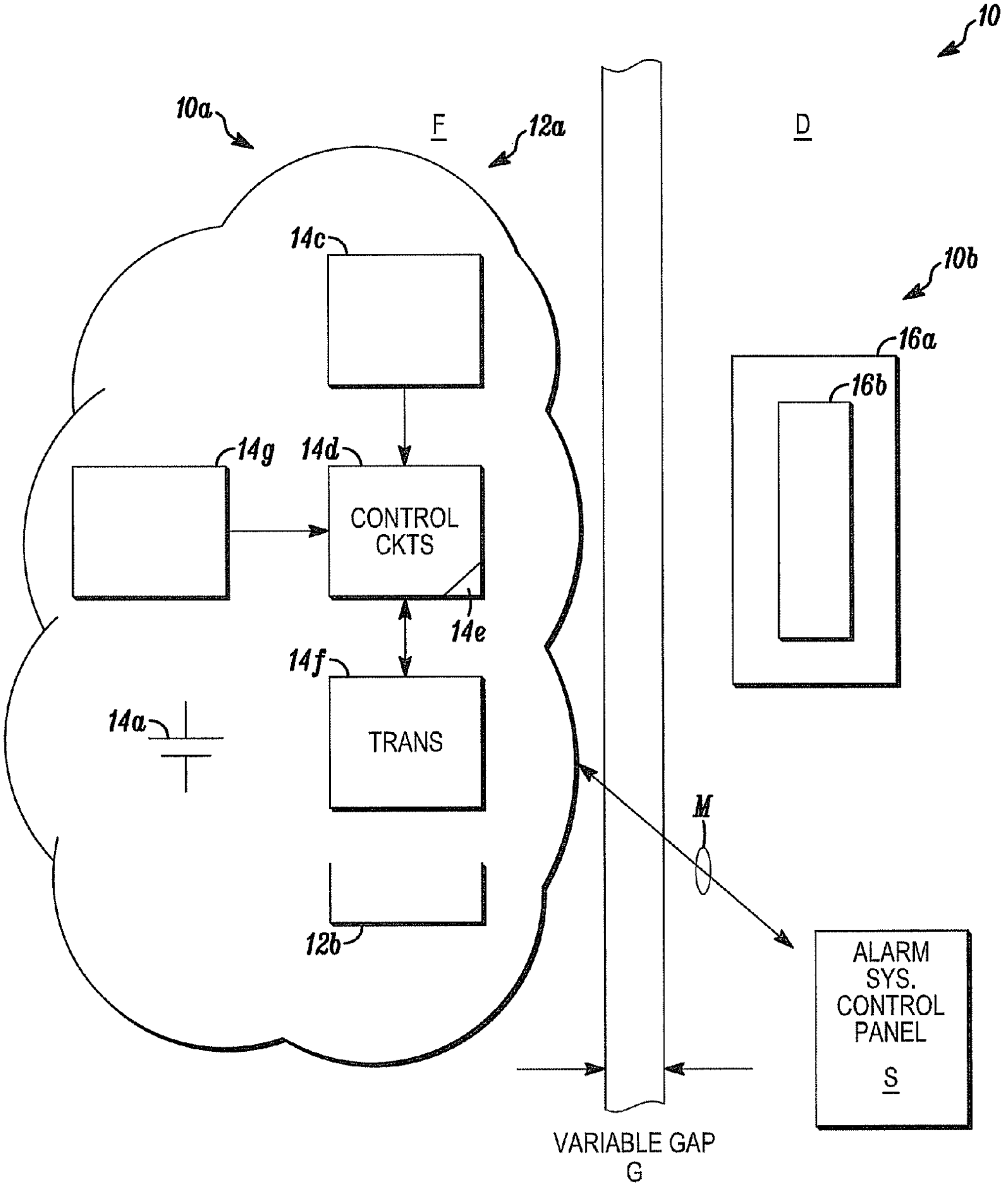
FIG. 1B is a block diagram of a portion of the detector of FIG. 1.

FIGS. 1-1B illustrate aspects of a detector 10. Detector 10 includes a detector assembly 10*a* and a magnet assembly 10*b*. Assembly 10*a* can be mounted, for example on a fixed object, such as a door or window frame F. Assembly 10*b* can be mounted on a movable member, such as a door or window D. Other arrangements are within the scope hereof.

Assembly 10*a* can include a hollow housing 12*a*, which is closed by a base 12*b*. The assembly 10*a* is energized by batteries 14*a* carried by base 12*b*. For example, the batteries are contained by battery terminals that are mounted to the printed circuit board 14*b* (PCB), the PCB is mounted in the housing 12*a* and the base prohibits motion of the batteries once the base is installed. The printed circuit board 14*b* carries a magnetometer 14*c* which is coupled to control circuits which can include a programmable processor, or controller, 14*d* along with executable control programs or software 14*e*, best seen in FIG. 1B.

The housing 12*a* can also carry a wireless transceiver 14*f* coupled to the control circuits 14*d* for communicating wirelessly via a medium M with a displaced alarm system control panel S. An optional tamper switch 14*g* can be coupled to the control circuits 14*d.*

The magnetometer 14*c* can be implemented with one of a variety of commercially available, low cost integrated circuits such as a single axis chip MMLP57H from MultiDimension Technology Co., Ltd., a multi-axis chip HMC5983 from Honeywell International Inc., or a multi-axis chip MAG3110 from Freescale, all without limitation. Those of skill will understand that a variety of programmable processors could be used with any of the above noted sensors without departing from the spirit and scope hereof.

Assembly 10*b* includes a housing 16*a* which carries a selectively oriented magnet 16*b*. For example, magnet 16*b* is illustrated in FIG. 1 oriented perpendicular to the gap direction. Those of skill will understand that the magnet 16*b* can exhibit a variety of shapes, and orientations, relative to the magnetometer, without departing from the spirit and scope hereof.

As discussed above, assembly 10*a* transmits determinations, based on real-time signals from magnetometer 14*c*, to the system S indicative of the door, or window, D moving from a closed position, relative to frame F to an open position. In one aspect, magnetometer 14*c* can be implemented as the above noted single axis chip MMLP57H. It will also be understood that other arrangements come within the spirit and scope hereof.

Figure 2:
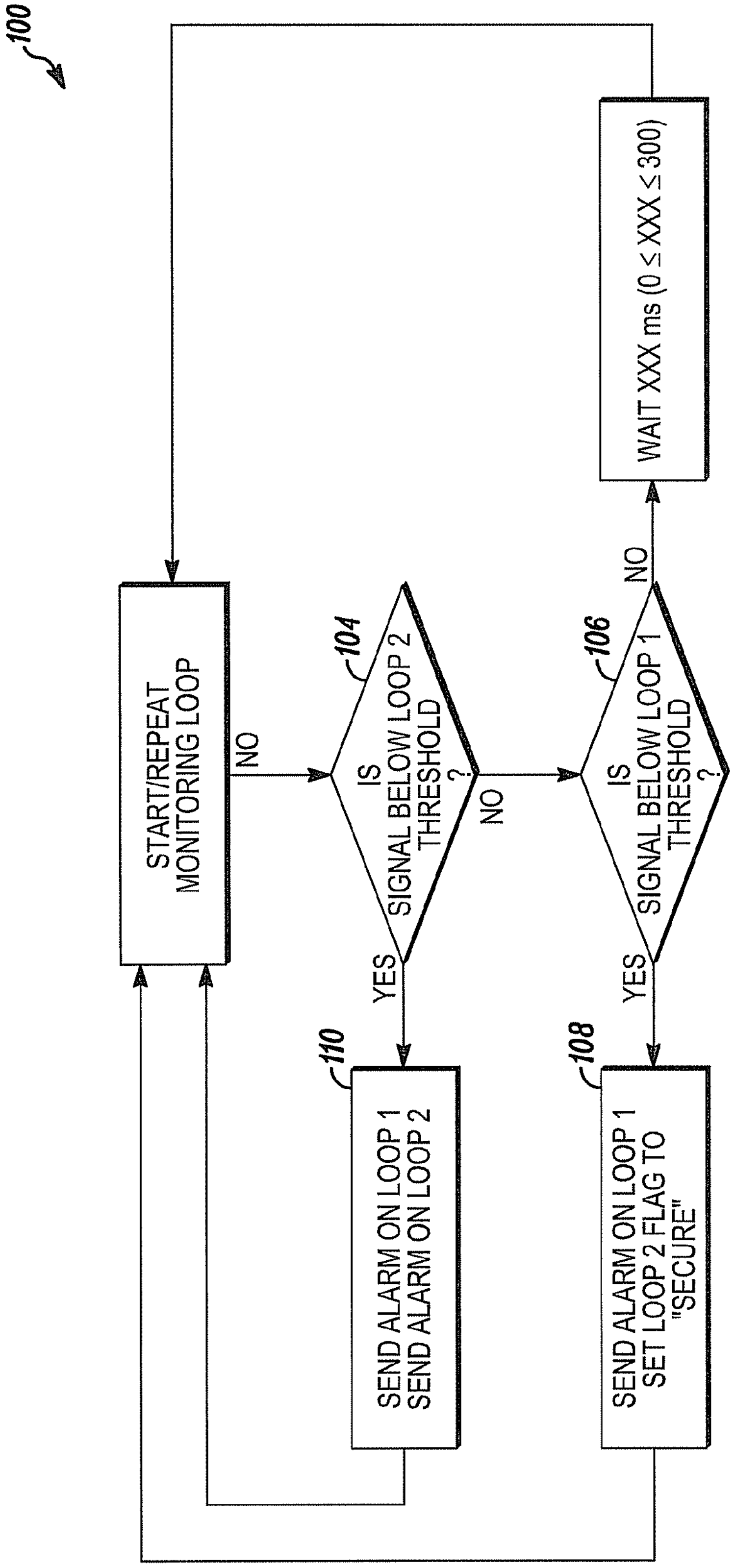
FIG. 2 is a flow diagram illustrating aspects of processing information obtained from a detector as in FIG. 1.

Responsive to the signal from sensor 14*c*, processing circuitry 14*d* can make a determination as to gap magnitude and transmit an indicium thereof to the system D. FIG. 2 illustrates dual loop exemplary processing 100.

In embodiments hereof, the circuitry 14*d* could perform the operations illustrated in FIG. 2 about 3 or more times per second. The circuitry 14*d* would monitor the field strength reported by the magnetometer 14*c*. It would compare the field strength to the threshold set for loop 2, as at 104, and if the signal exceeds that threshold, it would evaluate the signal relative to the threshold set for loop 1, as at 106. If below the loop 1 threshold, a loop 1 alarm could be transmitted and the loop 2 flag could be set to secure as at 108. Alternately, if the signal is below the loop 2 threshold, as at 104, alarms could be set on both loops 1, 2, as at 110.

FIGS. 3, 3A and 4A-4D illustrate aspects of a high security detector 30. Detector 30 includes a detector assembly 30*a* and a magnet assembly 30*b*. Assembly 30*a* can be mounted, for example, on a door frame F. Assembly 30*b* can be mounted on a movable object, such as a door D.

Assembly 30*a* can include a hollow housing 32*a*. The assembly 30*a* is energized via cables C which couple the detector 30 to the system S. In an alternate embodiment similar to that shown in FIG. 1, the assembly 30*a* can be energized by batteries. A printed circuit board 34*b* carries a magnetometer 34*c* which is coupled to control circuits 34*d* which can include a programmable processor, or controller, along with executable control programs or software such as seen in FIG. 1B.

The housing 32*a* can also carry cable drive/receive circuits including end-of-line resistors and varistors 34-1, 34-2 coupled to the control circuits. A tamper switch 34*g* can be coupled to the control circuits 34*d.*

Figure 3:
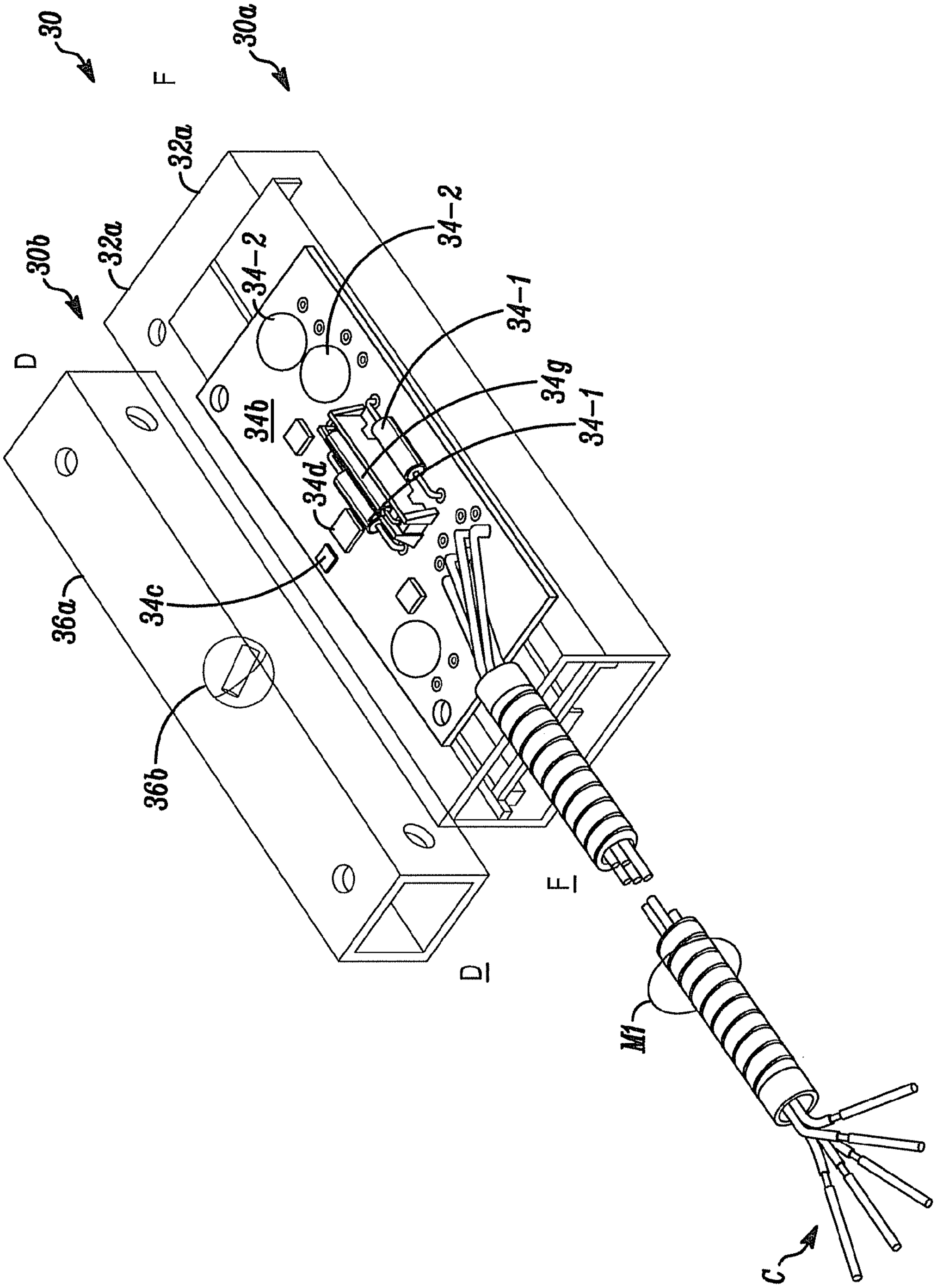
FIG. 3 is a perspective view of another detector in accordance herewith.
Figure 3A:
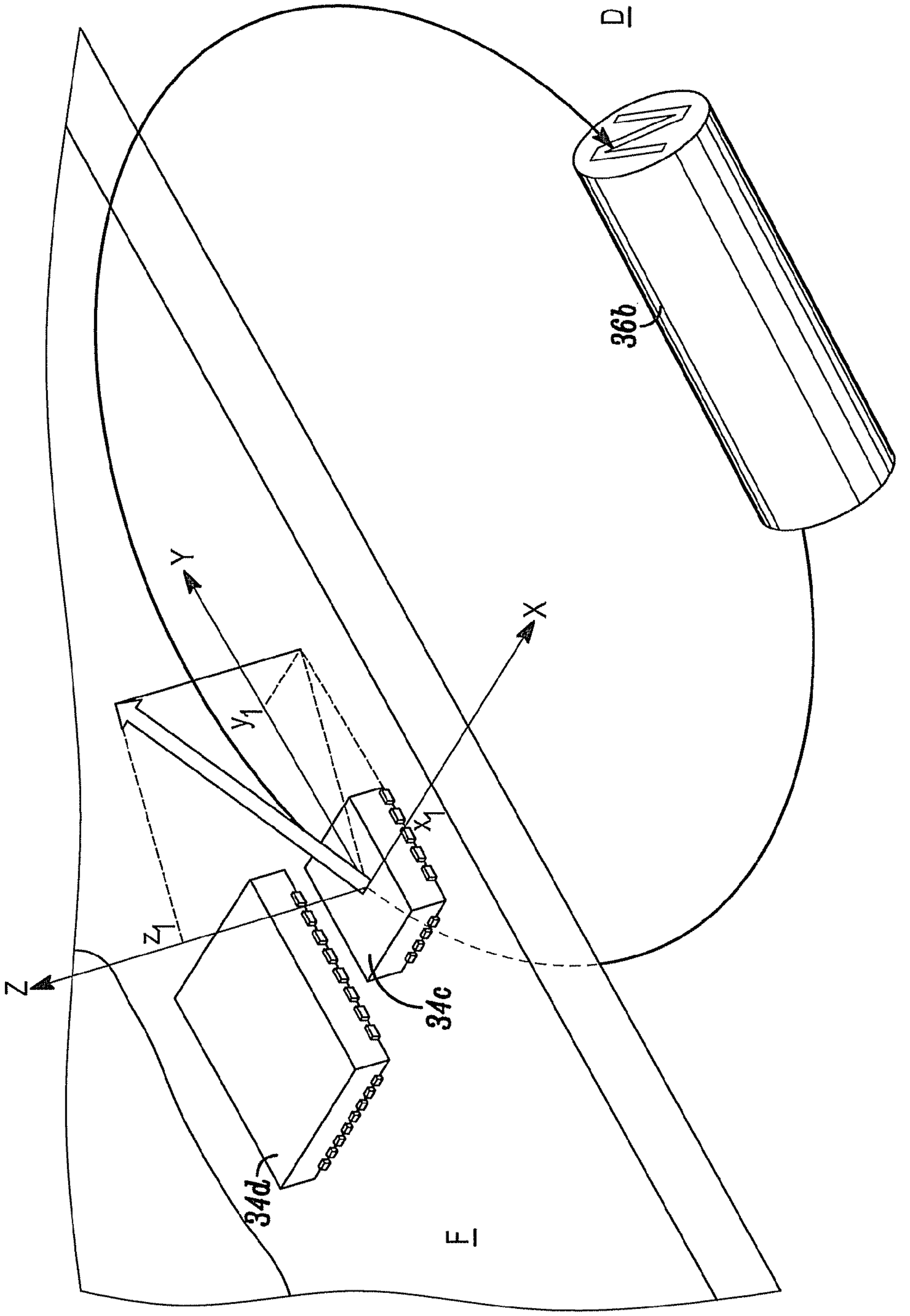
FIG. 3A illustrates other aspects of the embodiment of FIG. 3.

FIG. 3A illustrates various advantageous aspects of using a multi-axis magnetometer in combination with a randomly oriented magnet. With the random orientations, an intruder is faced with trying to duplicate a unique orientation and magnitude which makes detectors, such as the detector 30, significantly more defeat resistant.

Figure 4A:
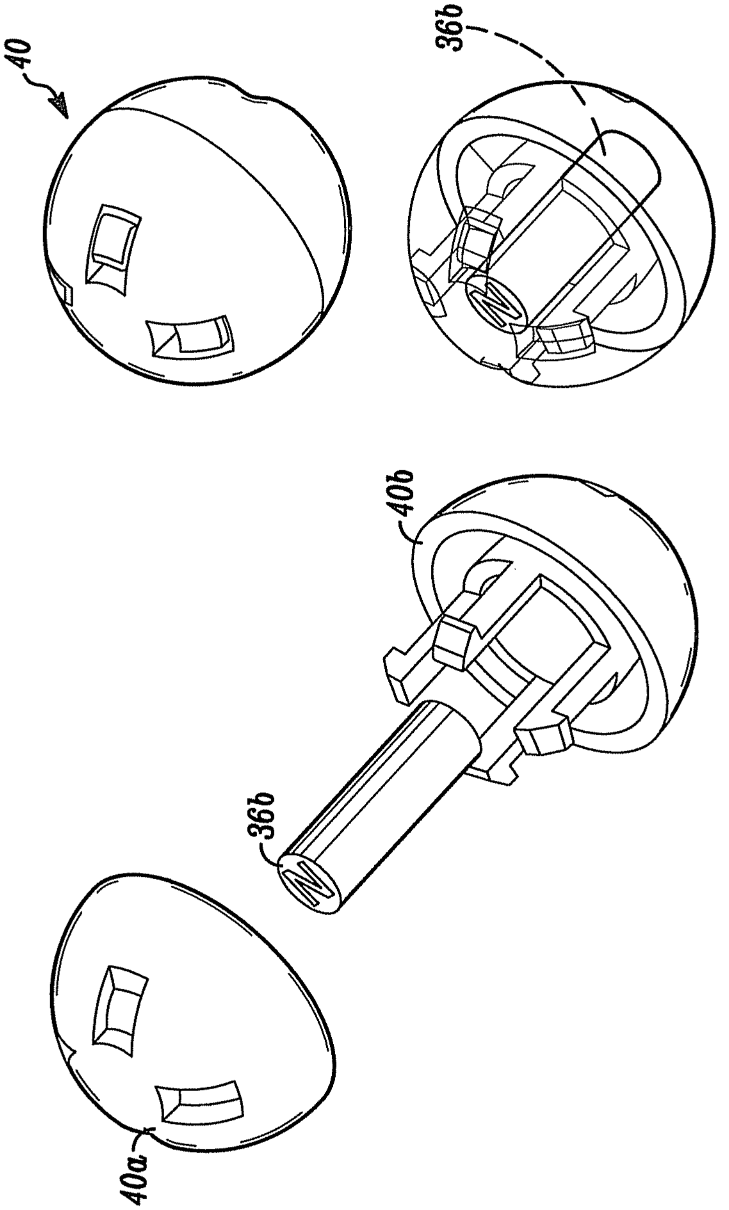
FIGS. 4A-4D taken together illustrate aspects of another method in accordance herewith.
Figures 1, 2, 4B:
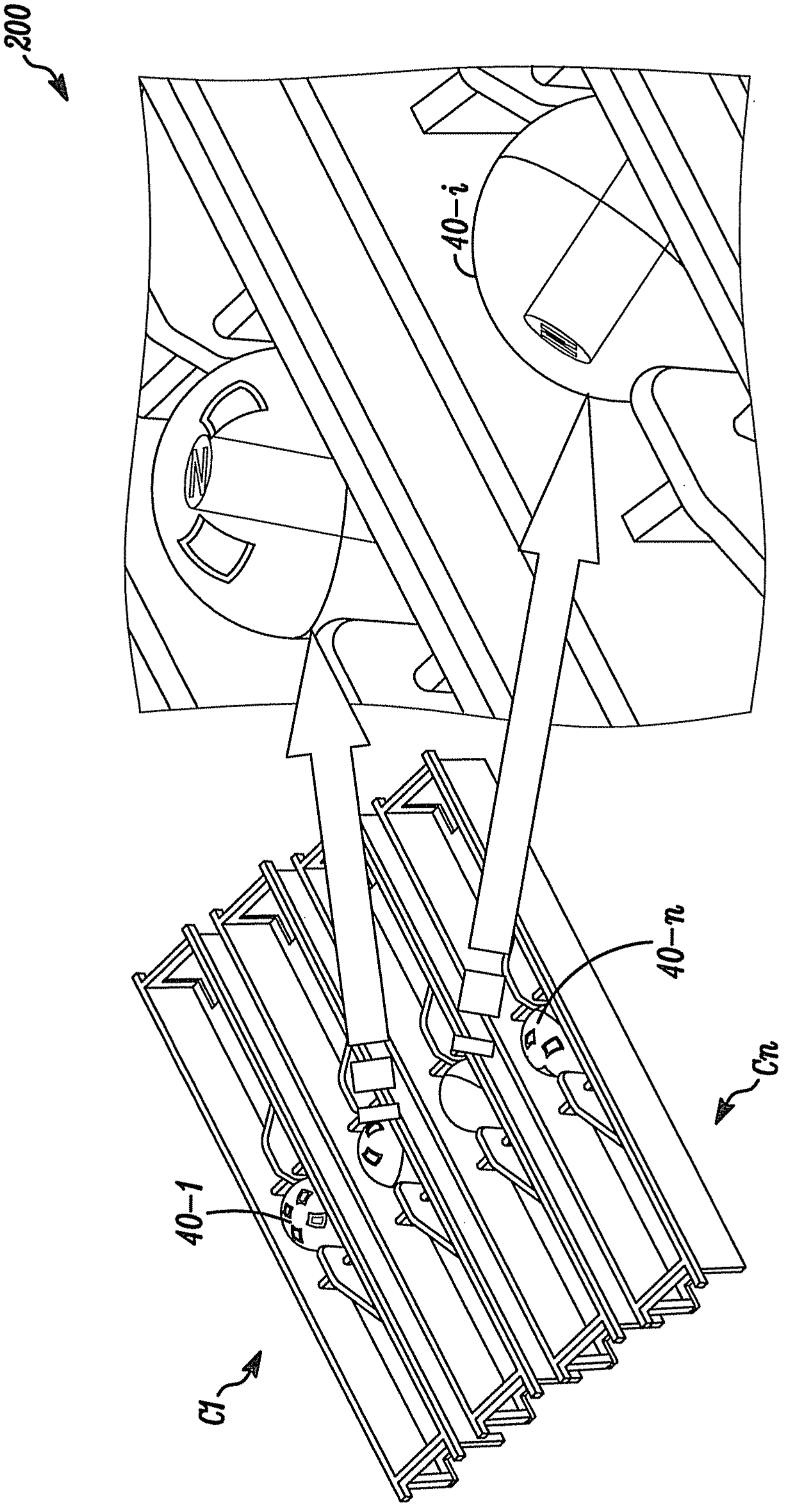

FIGS. 4A-4D illustrates aspects of a manufacturing method 200 which produces randomly oriented magnets 36*b* usable to provide security in the detector 30. As FIG. 4A illustrates assembling a magnet 36*b* in a spherical housing 40*a, b*. As illustrated in FIG. 4B a plurality of carriers C1 . . . Cn can carry a plurality of housings 40-*l* with each housing including a randomly oriented magnet, such as magnet 36*b.*

Figure 4C:
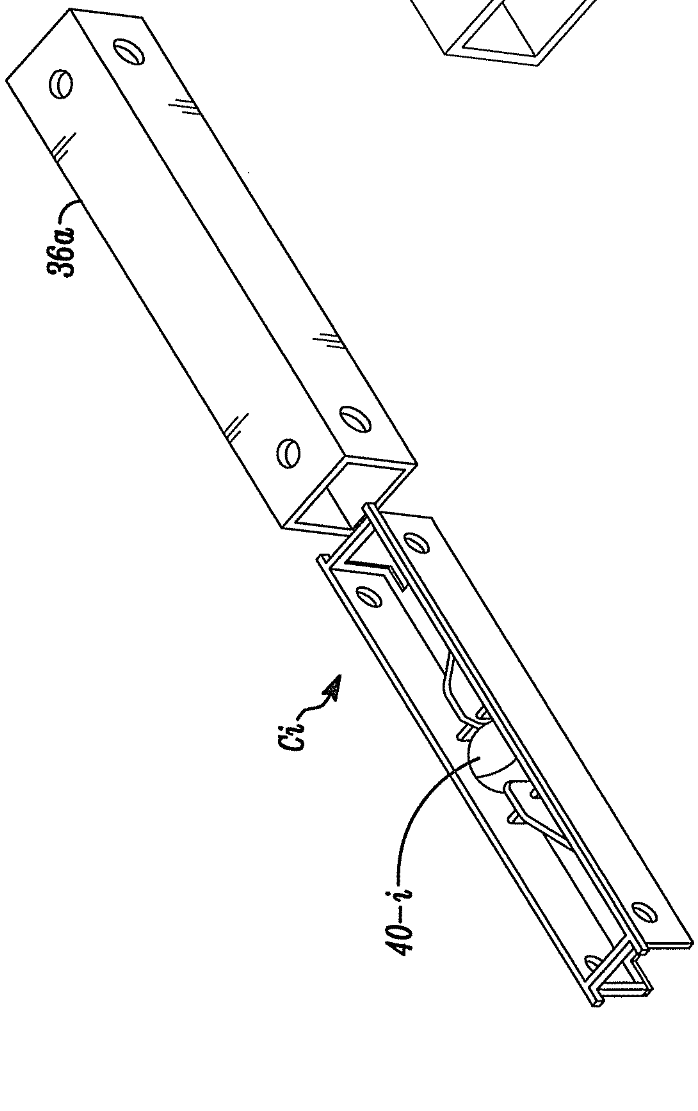
Figure 4D:
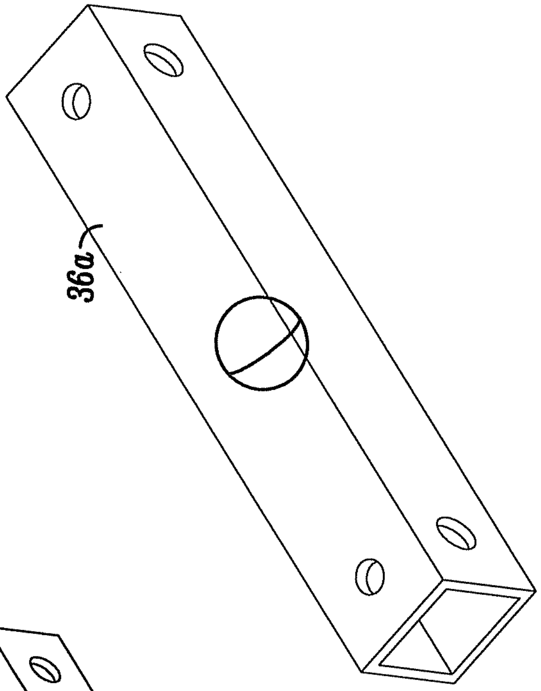

As in FIG. 4C, each of the carriers Ci with an associated magnet, such as 40-*l* can be inserted into a housing 36*a*. The respective housings, carriers and magnets can be potted with an epoxy, or other, compound, as in FIG. 4D, to fix the orientation of the respective magnet, such as 40-*i.*

Once potted the orientation of the magnet can not be determined visually. Hence, it makes it very difficult, if not impossible for an intruder to obtain a magnet with the same magnetic orientation as in the respective detector.

As illustrated in FIG. 4B-2, a boss 42 can be added to each respective sphere, such as 40-*l* to preclude the respective magnet, such as 36*b*, from ever being aligned with the X, Y, or Z axis of the respective magnetometer, such as 34*c*.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

Further, logic flows depicted in the figures do not require the particular order shown, or sequential order, to achieve desirable results. Other steps may be provided, or steps may be eliminated, from the described flows, and other components may be add to, or removed from the described embodiments.

The invention claimed is:

1. A detector comprising:

a proximity sensor; and circuitry having first and second distance sensing thresholds, wherein the circuitry compares a proximity signal, from the sensor, to the first distance sensing threshold, wherein, when the proximity signal fails to exceed the first distance sensing threshold, the circuitry sends a signal indicative of an alarm relative to both the first and second distance sensing thresholds to a displaced control unit, wherein, when the proximity signal exceeds the first distance sensing threshold, the circuitry compares the proximity signal to the second distance sensing threshold, wherein, when the proximity signal fails to exceed the second distance sensing threshold, the circuitry sends a signal indicative of an alarm relative to the second distance sensing threshold and a signal indicative of a normal state relative to the first distance sensing threshold to the displaced control unit, and wherein, when the proximity signal exceeds the second distance sensing threshold, the circuitry sends a signal indicative of a normal state relative to the first and second distance sensing thresholds to the displaced control unit.

2. The detector as in claim 1, wherein the proximity sensor is part of an intrusion security system and detects an open or closed position of an element selected from a class which includes at least a door, a window, or a gate.

3. The detector as in claim 2, wherein the proximity sensor is a wireless sensor and transmits alarm status on individual reporting loops for each threshold.

4. The detector as in claim 2, wherein the proximity sensor is mountable to at least one of a door frame, a window frame, or a fence post and detects a target mountable to one of a door, a window or a gate.

5. The detector as in claim 4, wherein the proximity sensor contains a magnetometer and the target contains a permanent magnet.

6. The detector as in claim 5, wherein the distance sensing thresholds for each loop are sets of thresholds wherein the each threshold set accounts for orientation of the permanent magnet providing either positive or negative magnetic flux.

* * * * *